(12) United States Patent
Watanabe et al.

(10) Patent No.: US 12,178,111 B2
(45) Date of Patent: Dec. 24, 2024

(54) VAPOR DEPOSITION MASK AND METHOD OF MANUFACTURING DEVICE USING VAPOR DEPOSITION MASK

(71) Applicant: CANON KABUSHIKI KAISHA, Tokyo (JP)

(72) Inventors: Shinichiro Watanabe, Kanagawa (JP); Takahiro Yajima, Kanagawa (JP); Tatsuya Saito, Kanagawa (JP); Tatsuro Uchida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 465 days.

(21) Appl. No.: 17/510,789

(22) Filed: Oct. 26, 2021

(65) Prior Publication Data

US 2022/0131116 A1    Apr. 28, 2022

(30) Foreign Application Priority Data

Oct. 28, 2020 (JP) .................. 2020-180170

(51) Int. Cl.
*H10K 71/00* (2023.01)
*C23C 14/04* (2006.01)
*C23C 16/04* (2006.01)
*H10K 71/16* (2023.01)

(52) U.S. Cl.
CPC ........... *H10K 71/00* (2023.02); *C23C 14/042* (2013.01); *C23C 16/042* (2013.01); *H10K 71/166* (2023.02)

(58) Field of Classification Search
None
See application file for complete search history.

(56) References Cited

U.S. PATENT DOCUMENTS

| | | | |
|---|---|---|---|
| 2002/0111035 A1* | 8/2002 | Atobe | H01L 21/0337 257/E21.038 |
| 2005/0051516 A1* | 3/2005 | Yotsuya | C30B 33/00 216/51 |
| 2017/0275749 A1 | 9/2017 | Sato | |
| 2018/0315925 A1 | 11/2018 | Vazan et al. | |
| 2018/0340252 A1 | 11/2018 | Vazan et al. | |
| 2020/0131617 A1 | 4/2020 | Donoghue et al. | |

FOREIGN PATENT DOCUMENTS

| | | |
|---|---|---|
| CN | 1431851 A | 7/2003 |
| CN | 1452010 A | 10/2003 |
| CN | 1678145 A | 10/2005 |

(Continued)

OTHER PUBLICATIONS

Google machine translation (Year: 2024).*

*Primary Examiner* — Michael Lebentritt
(74) *Attorney, Agent, or Firm* — Canon U.S.A., Inc. I.P. Division

(57) ABSTRACT

A vapor deposition mask includes a silicon substrate including a first region that has a first thickness and that includes a part in which a plurality of through-holes is arranged, and a second region that is arranged at an outer circumference of the first region and that has a second thickness that is greater than the first thickness. The silicon substrate has an inner wall that constitutes a step between the first region and the second region. An outer edge of the inner wall has a curve portion in a plan view, and the inner wall has a plurality of steps in a cross-section view.

20 Claims, 15 Drawing Sheets

(56) References Cited

FOREIGN PATENT DOCUMENTS

| | | | | |
|---|---|---|---|---|
| CN | 1834282 A | | 9/2006 | |
| CN | 101996919 A | | 3/2011 | |
| CN | 106119773 A | | 11/2016 | |
| CN | 110651374 A | * | 1/2020 | ........... C23C 14/042 |
| CN | 110724906 A | | 1/2020 | |
| JP | 2001185350 A | | 7/2001 | |
| JP | 2002217331 A | * | 8/2002 | ....... H01L 21/76898 |
| JP | 2002220656 A | * | 8/2002 | ........... C23C 14/042 |
| JP | 2002313564 A | | 10/2002 | |
| JP | 2004036001 A | * | 2/2004 | ........... C23C 14/042 |
| JP | 2005042133 A | | 2/2005 | |
| JP | 2005293917 A | | 10/2005 | |
| JP | 2005294206 A | | 10/2005 | |
| JP | 2008208426 A | | 9/2008 | |
| JP | 4222035 B2 | * | 2/2009 | ........... C23C 14/042 |
| JP | 2010056228 A | | 3/2010 | |
| JP | 2019074546 A | | 5/2019 | |
| JP | 2020521058 A | | 7/2020 | |
| KR | 100903818 B1 | * | 11/2003 | |
| KR | 20200080205 A | * | 6/2020 | |
| TW | 1825149 B | * | 8/2019 | |
| WO | WO-2018221852 A1 | * | 12/2018 | ........... C23C 14/042 |

* cited by examiner

VAPOR DEPOSITION MASK AND METHOD OF MANUFACTURING DEVICE USING VAPOR DEPOSITION MASK

BACKGROUND OF THE INVENTION

Field of the Invention

The present disclosure relates to a vapor deposition mask using a semiconductor substrate, a method of manufacturing a device using the vapor deposition mask, and the like.

Description of the Related Art

A plurality of methods of manufacturing an organic light emitting diode (OLED) has been proposed. Specifically, used are a method of etching an organic material formed as a film on a substrate to produce the OLED, a method of dispensing the organic material using an inkjet method to separately apply the organic material, and a method of separately applying the organic material by vapor deposition using a metal mask. Among these methods, the method of separately applying the organic material using the metal mask has been used in many cases. In a case of using the metal mask, however, since the metal mask warps under its own weight as the metal mask becomes thinner, it is difficult to separately apply the organic material with the warped metal mask with high accuracy.

With the development of a higher definition display in late years, it becomes further necessary to separately apply the organic material in a fine manner and apply the organic material with high positional accuracy. Hence, the metal mask needs to be made thinner and the accuracy in processing a through-hole needs to be increased. With the usage of the metal mask, however, even if the through-hole is formed with predetermined processing accuracy, warping of the mask at the time of vapor deposition becomes large and the shape of the through-hole changes, so that the accuracy of a position of vapor deposition is reduced.

Japanese Patent Application Laid-Open No. 2002-313564 discusses a vapor deposition mask (shadow mask) using a silicon substrate that is lightweight and that has high tensile strength. According to Japanese Patent Application Laid-Open No. 2002-313564, a vapor deposition mask region having a thickness of several dozen micrometers at a central portion of the silicon substrate is formed so that a frame is left on the circumference of the silicon substrate. This mask region is formed by photolithography and etching. Using the silicon substrate instead of a metal substrate can reduce warping and provide the vapor deposition mask that prevents reduction of accuracy in vapor deposition position.

The silicon substrate is processed with higher processing accuracy than the metal substrate, is lightweight, and has high tensile strength, but nevertheless, has characteristics of being brittle and easily broken. Hence, there is a risk that the silicon substrate is broken at the time of conveyance or vapor deposition unless being processed into an appropriate shape.

FIGS. 15A and 15B each illustrate a vapor deposition mask (shadow mask) 101 formed of a single-crystal silicon according to Japanese Patent Application Laid-Open No. 2002-313564. FIG. 15A is a plan of the vapor deposition mask 101 described in Japanese Patent Application Laid-Open No. 2002-313564, and FIG. 15B is a cross-section diagram of the vapor deposition mask 101 along an A-A' line in FIG. 15A. In the vapor deposition mask 101, a silicon frame 102 that is thicker than a central portion is formed around a shadow mask region 103 in thickness of several dozen micrometers at the central portion. To process the shadow mask region 103 inside the silicon frame 102 to be in the thickness of several dozen micrometers, thinning processing is performed by etching using a mixed solution of nitric acid, hydrofluoric acid, and glacial acetic acid, or a potassium hydroxide aqueous solution, or an ultrasonic wave processing method. An outer edge of an inner wall 104 of the silicon frame 102 illustrated in FIG. 15A has a quadrangle shape in a plan view, and has a structure of having corner portions C at respective four corners of the inner wall 104 in the plan view. Hence, there is a risk that the vapor deposition mask is broken due to stress concentration on the corner portions at the time of handling the vapor deposition mask, or causing a holding substrate to hold the vapor deposition mask and fixing the vapor deposition mask to the holding substrate.

SUMMARY OF THE INVENTION

In view of these circumstances, the present disclosure is directed to provision of a vapor deposition mask that is capable of reducing a risk for breakage at the time of handling the vapor deposition mask, or causing a holding substrate (mask holder) to hold the vapor deposition mask and fixing the vapor deposition mask to the holding substrate, and that prevents reduction of accuracy in vapor deposition position. The present disclosure is also directed to provision of a vapor deposition apparatus using the vapor deposition mask, a method of manufacturing a device utilizing the vapor deposition mask, and the like.

According to an aspect of the present disclosure, a vapor deposition mask includes a silicon substrate including a first region that has a first thickness and that includes a part in which a plurality of through-holes is arranged, and a second region that is arranged at an outer circumference of the first region and that has a second thickness that is greater than the first thickness, wherein the silicon substrate has an inner wall that constitutes a step between the first region and the second region, wherein an outer edge of the inner wall has a curve portion in a plan view, and wherein the inner wall has a plurality of steps in a cross-section view.

Further features of the present disclosure will become apparent from the following description of exemplary embodiments with reference to the attached drawings.

DESCRIPTION OF THE EMBODIMENTS

Exemplary embodiments to implement the present disclosure will be described below with reference to the accompanying drawings.

Figure 1A:
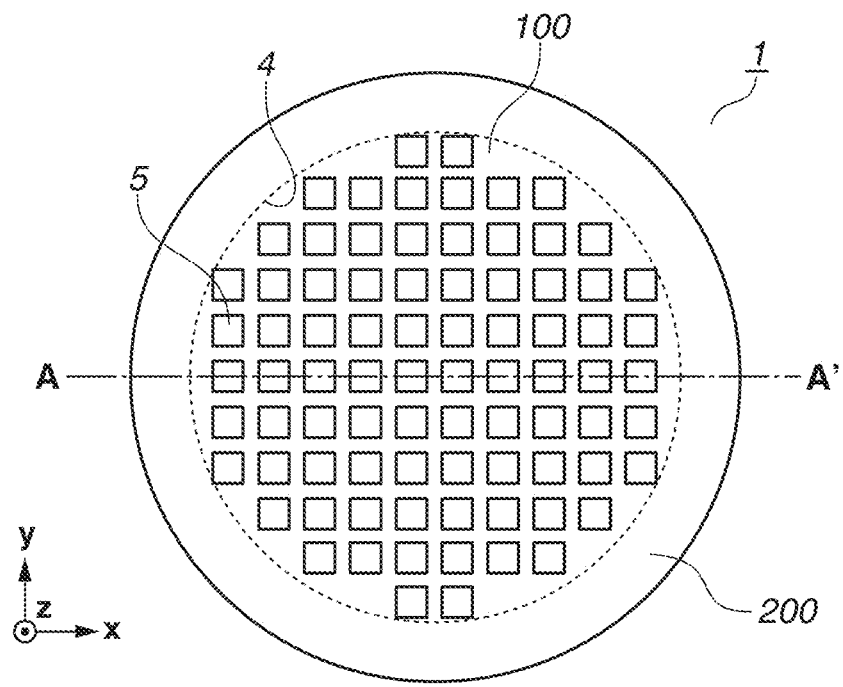
FIG. 1A is a plan of a vapor deposition mask according to exemplary embodiments of the present disclosure.
Figure 1B:
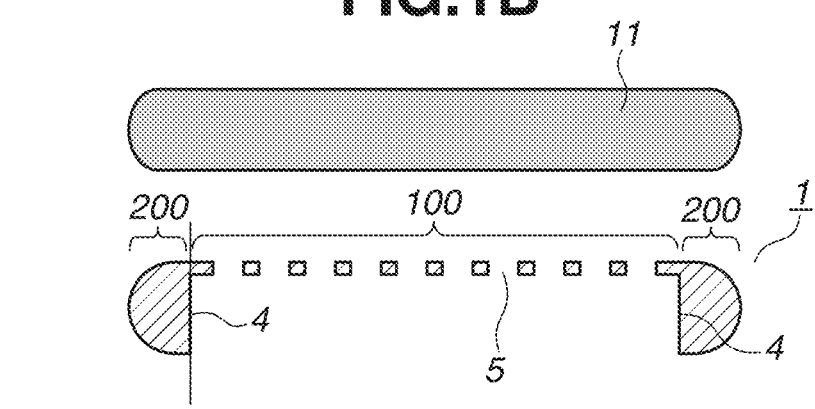
FIG. 1B is a cross-section diagram of the vapor deposition mask according to the exemplary embodiments of the present disclosure.
Figure 1B:
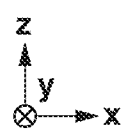
Figure 1B:
Figure 1B:

FIG. 1A is a plan of a vapor deposition mask 1 according to the exemplary embodiments of the present disclosure. FIG. 1B is a cross-section diagram of the vapor deposition mask 1 along an A-A' line in FIG. 1A. The plan is also referred to as a plan view, and the cross-section diagram is also referred to as a cross-section view. FIG. 1A is a diagram illustrating an X-Y plane, and FIG. 1B is a diagram illustrating an X-Z plane. A length in an X-direction is referred to as a width, and a length in a Z-direction is referred to as a height. That is, a height of a first surface being greater than a height of a second surface means that the first surface is positioned in a more positive direction in the Z-direction than the second surface is. In contrast, the height of the first surface being less than the height of the second surface means that the first surface is positioned in a more negative direction in the Z-direction than the second surface is. With respect to the silicon substrate, a length in the Z-direction may be referred to as a thickness.

In FIG. 1B, assume that a vapor-deposited substrate 11 side of the vapor deposition mask 1 is an upper surface, and a vapor deposition material source 10 side is a lower surface of the vapor deposition mask 1. A vapor deposition material flies from the lower surface side of the vapor deposition mask 1, passes through a through-hole 5, and is then formed as a film on the vapor-deposited substrate 11. A plurality of through-holes 5 is formed, and assume that a region in which the plurality of through-holes 5 is formed is a first region 100. A second region 200 in which a substrate thickness is greater than that in the first region 100 is formed around the first region 100. An inner wall 4 is formed so as to surround a space on the lower surface side in the first region 100. The inner wall 4 also serves as a member constituting a step between the first region 100 and the second region 200.

As illustrated in FIG. 1A, the first region 100 is surrounded by an outer edge of the inner wall 4 in a plan view, and the outer edge of the inner wall 4 has a curve portion in the plan view. For example, the outer edge of the inner wall 4 has a circular shape. The "curve portion" mentioned herein is a portion without a corner portion and in a state of being continuously curved. The "corner portion" mentioned herein is a shape formed by two sides extending from one vertex. Such a configuration without the corner portion can prevent occurrence of stress concentration, and further increase mechanical strength.

The second region 200 in which the substrate thickness is greater than that in the first region 100 is formed around the first region 100. An outer edge on an outermost circumference of the second region 200 also has a curve portion in a plan view, similarly to the outer edge of the inner wall 4. For example, the outer edge of the outermost circumference in the second region 200 has a circular shape. Arranging the second region 200 in which the substrate thickness is greater than that in the first region 100, relative to the first region 100 can increase mechanical intensity of the vapor deposition mask 1. Since the outer edge of the outermost circumference in the second region 200 has the curve portion, the present exemplary embodiment can prevent occurrence of stress concentration and further increase mechanical strength.

With this configuration, by having the curve portion at each of the outer edge of the inner wall 4 and the outer edge of the outermost circumference, even the vapor deposition mask composed of the semiconductor substrate can reduce occurrence of stress concentration on the vapor deposition mask at the time of causing the holding substrate to hold the vapor deposition mask and fixing the vapor deposition mask to the holding substrate, and reduce a risk for breakage of the vapor deposition mask. In addition, the present exemplary embodiments use the vapor deposition mask composed of the semiconductor substrate, and can thereby prevent reducing accuracy in vapor deposition position.

While FIGS. 1A and 1B each illustrate an example in which the entire outer edge of the inner wall 4 has the curve portion and the entire outer edge of the outermost circumference of the second region 200 has the curve portion in a plan view, the entire outer edge does not necessarily have the curve portion in order to exhibit advantageous effects of the disclosure. For example, the vapor deposition mask 1 is only required to have a configuration of not having the corner portion in a range corresponding to at least half of the entire length of the inner wall 4 or at least half of the entire length of the outer edge of the outermost circumference. A linear slit (orientation flat or notch) indicating a direction of a crystal axis is arranged on the semiconductor substrate in many cases. In the present specification, however, this is not included in the corner portion at the outer edge of the outermost circumference.

Figure 2A:
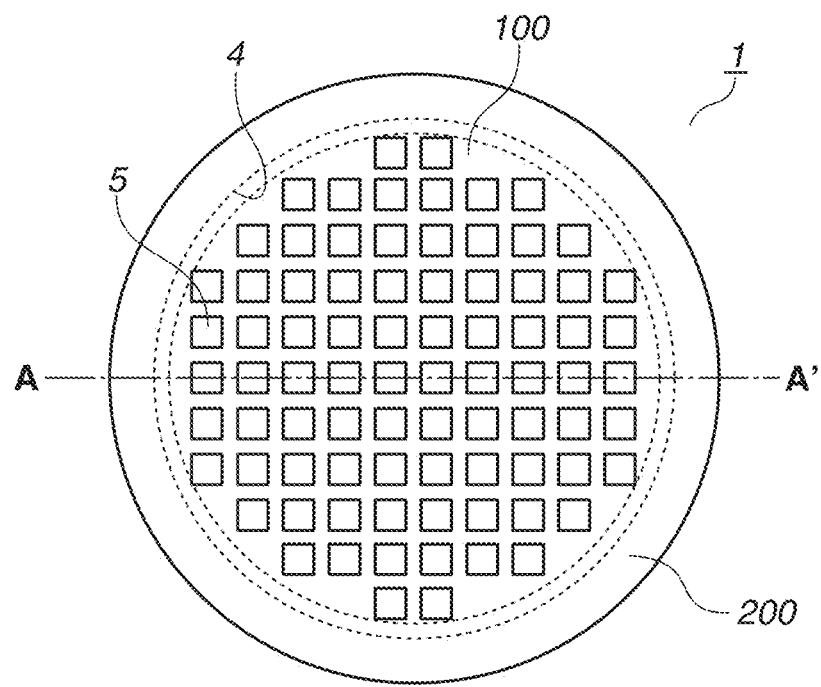
FIG. 2A is a plan of the vapor deposition mask according to a first exemplary embodiment.
Figure 2B:
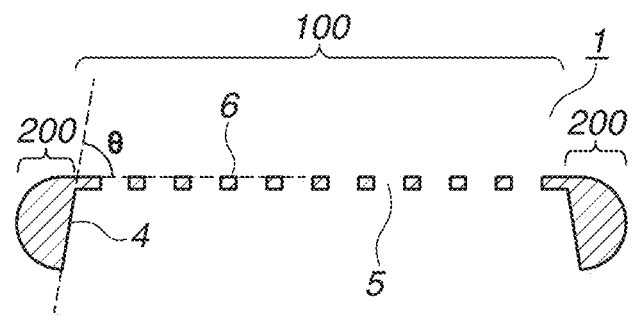
FIG. 2B is a cross-section diagram of the vapor deposition mask according to the first exemplary embodiment.

FIG. 2A is a plan of the vapor deposition mask 1 according to a first exemplary embodiment. FIG. 2B is a cross-section diagram of the vapor deposition mask 1 along an A-A' line in FIG. 2A.

A substrate having a diameter of 200 mm (with a permitted error of ±0.5 mm) can be used for the vapor deposition mask 1 according to the first exemplary embodiment. In this case, a silicon single crystal substrate, a silicon on insulator (SOI) substrate, or the like, which has a substrate thickness of 100 μm or more and 750 μm or less, can be used. Alternatively, a substrate having a diameter of 300 mm (with a permitted error of ±0.2 mm) can also be used. In this case, a silicon single crystal substrate, an SOI substrate, or the like, which has a substrate thickness of 100 μm or more and 800 μm or less, can be used.

In consideration of mechanical strength, there is a case of configuring the vapor deposition mask 1 while part of the vapor deposition mask 1 in the second region 200 remains to be thick. In this case, a thickness in the second region 200 of the silicon substrate having the diameter of 200 mm is 200 μm or more and 750 μm or less. A thickness in the second region 200 of the silicon substrate having the diameter of 300 mm is 300 μm or more and 800 μm or less. This value of the thickness is a value of the greatest thickness in the second region 200, and does not include a thickness of a countersink portion, which will be described below.

On the other hand, a thickness in the first region 100 is about 1 μm to 100 μm. More specifically, the thickness is 5 μm or more and 50 μm or less. Hence, a ratio between the thickness of the silicon substrate in the first region 100 and the thickness of the silicon substrate in the second region 200 is from 4 to 160.

A method of manufacturing the vapor deposition mask 1 is as follows. First, a mask pattern for forming the through-holes 5 is formed on the upper surface in the first region 100 by photolithography and etching. Subsequently, the substrate is thinned down to several dozen micrometers by reactive ion etching (RIE) or machine processing from the lower surface in the first region 100, and thereafter the through-holes 5 are formed by RIE from the upper surface. At the time of performing thinning processing on the substrate in the first region 100, the inner wall 4 surrounding the space on the lower surface side in the first region 100 is simultaneously formed.

The outer edge of the inner wall 4 has the curve portion in a plan view, and has, for example, a circular shape. In addition, the outer edge of the outermost circumference in the second region 200 also has the curve portion in the plan view, and has, for example, a circular shape. Such a configuration of not having a corner portion can prevent occurrence of stress concentration and further increase mechanical strength.

The through-hole 5 can be processed by RIE, and thus can be formed with high dimensional accuracy. A width of the through-hole 5 is 5 to 40 mm, and is, for example, 30 mm. The shape of the through-hole 5 is not limited to a quadrangle, and can be freely changed as necessary. As illustrated in FIG. 2B, an angle θ between an upper surface 6 of the vapor deposition mask 1 and the inner wall 4 is smaller than 90°. That is, the angle θ is an acute angle. That is, an angle between the lower surface side in the first region 100 and the inner wall 4 is larger than 90°, oppositely to the upper surface. With such a configuration, an angle between the lower surface side in the first region 100 and the inner wall 4 is an obtuse angle. This configuration can further reduce occurrence of stress concentration on the first region 100 whose thickness is small, at the time of handling the vapor deposition mask formed of the semiconductor substrate, or causing the holding substrate to hold the vapor deposition mask and fixing the vapor deposition mask to the holding substrate. In addition, the configuration can reduce a risk for breakage of the vapor deposition mask.

First Modification

Figure 3:
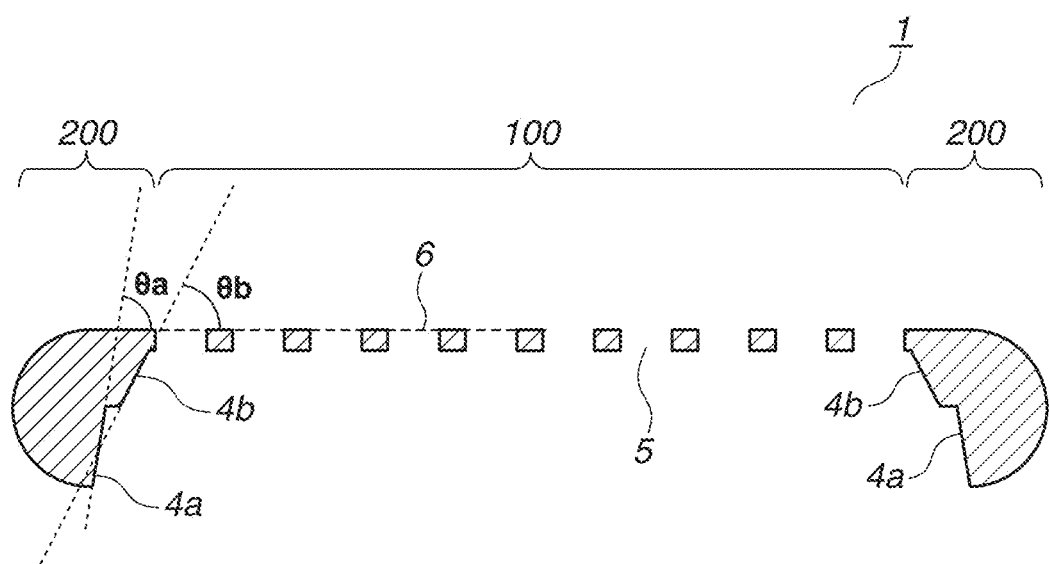
FIG. 3 is a cross-section diagram illustrating a vapor deposition mask according to a first modification of the first exemplary embodiment.

FIG. 3 illustrates a cross section at a position identical to that of the cross section of the vapor deposition mask 1 along the A-A' line in FIG. 2A, but a cross-section shape of the inner wall 4 is different from that illustrated in FIG. 2B. In FIG. 3, a shape of the inner wall 4 is a step shape composed of two steps, and the two steps have different angles with respect to the upper surface in the first region 100. Assume that an angle between an inner wall 4a on the lower surface side of the vapor deposition mask 1 and the upper surface 6 of the vapor deposition mask 1 is an angle θa. Assume that an angle between an inner wall 4b on the upper surface side of the vapor deposition mask 1 and the upper surface 6 of the vapor deposition mask 1 is an angle θb. In this case, a relationship of θa>θb holds. Hence, the angle between the lower surface side in the first region 100 and the inner wall 4b on the upper surface side of the vapor deposition mask 1 is a more obtuse angle than the angle between the lower surface side in the first region 100 and the inner wall 4a on the lower surface side of the vapor deposition mask 1. This configuration can further reduce occurrence of stress concentration on the first region 100 whose thickness is small, at the time of handling the vapor deposition mask formed of the semiconductor substrate, or causing the holding substrate to hold the vapor deposition mask and fixing the vapor deposition mask to the holding substrate. In addition, the configuration can reduce a risk for breakage of the vapor deposition mask.

While FIG. 3 illustrates a case of the inner wall 4 having the two-step configuration, the inner wall 4 is not limited to this configuration. Adopting a configuration of having an increased number of steps can cause a step closer to the through-hole 5 to have a more obtuse angle. This can further reduce a risk for breakage of the vapor deposition mask.

Second Modification

Figure 4:
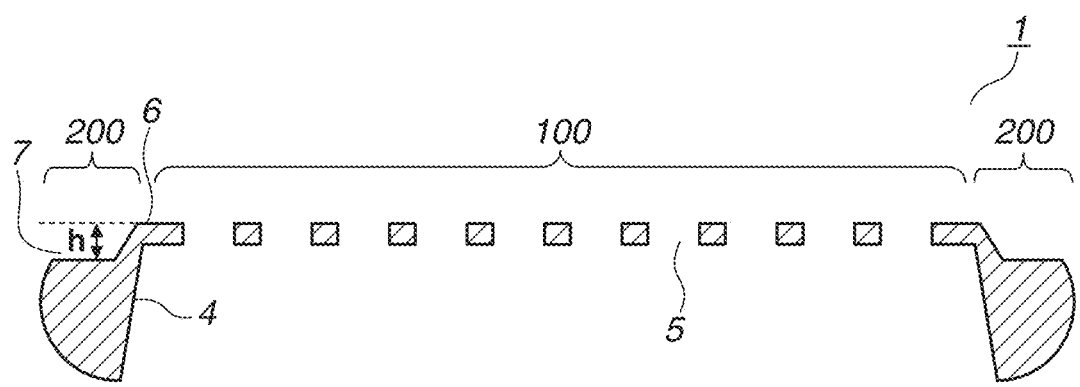
FIG. 4 is a cross-section diagram illustrating a vapor deposition mask according to a second modification of the first exemplary embodiment.

FIG. 4 illustrates a cross section at a position identical to that of the cross section of the vapor deposition mask 1 along the A-A' line in FIG. 2A, but a cross-section shape of the second region 200 is different from that illustrated in FIG. 2B.

In FIG. 4, a countersink portion 7 is formed in which part of the upper surface in the second region 200 is lower by a height h from the upper surface 6 of the vapor deposition mask 1. The countersink portion 7 is a location in which a jig for fixing the vapor deposition mask 1 to a mask holder, which will be described below, is pressed. The countersink portion 7 is also a location where a jig for conveying the vapor-deposited substrate 11 is prevented from being in contact with the vapor deposition mask 1 at the time of bringing the vapor-deposited substrate 11 closer to the vapor deposition mask 1.

While FIG. 4 illustrates an example of arranging countersink portions 7 in two locations, the countersink portions 7 can be arranged in a plurality of locations of the vapor deposition mask 1. In addition, the height h from the upper surface 6 of the vapor deposition mask 1 can be freely-changed in accordance with a shape of the jig that is pressed against the countersink portion 7. Furthermore, the countersink portion 7 may penetrate part of the vapor deposition mask 1.

As illustrated in FIG. 4, the inner wall 4 of the vapor deposition mask 1 and the outer edge of the outer circumference of the vapor deposition mask 1 each have a circular shape even if part of the vapor deposition mask 1 is thinner because of the arrangement of the countersink portion 7 in the second region 200. This configuration can prevent the occurrence of stress concentration on the vapor deposition mask at the time of handling the vapor deposition mask formed of the semiconductor substrate, or causing the holding substrate to hold the vapor deposition mask and fixing the vapor deposition mask to the holding substrate, and reduce a risk for breakage of the vapor deposition mask.

In a second exemplary embodiment, a description will be given of a vapor deposition apparatus and steps of producing a device using the vapor deposition mask, specifically, part of steps of producing an organic light emitting diode (OLED).

Figure 5:
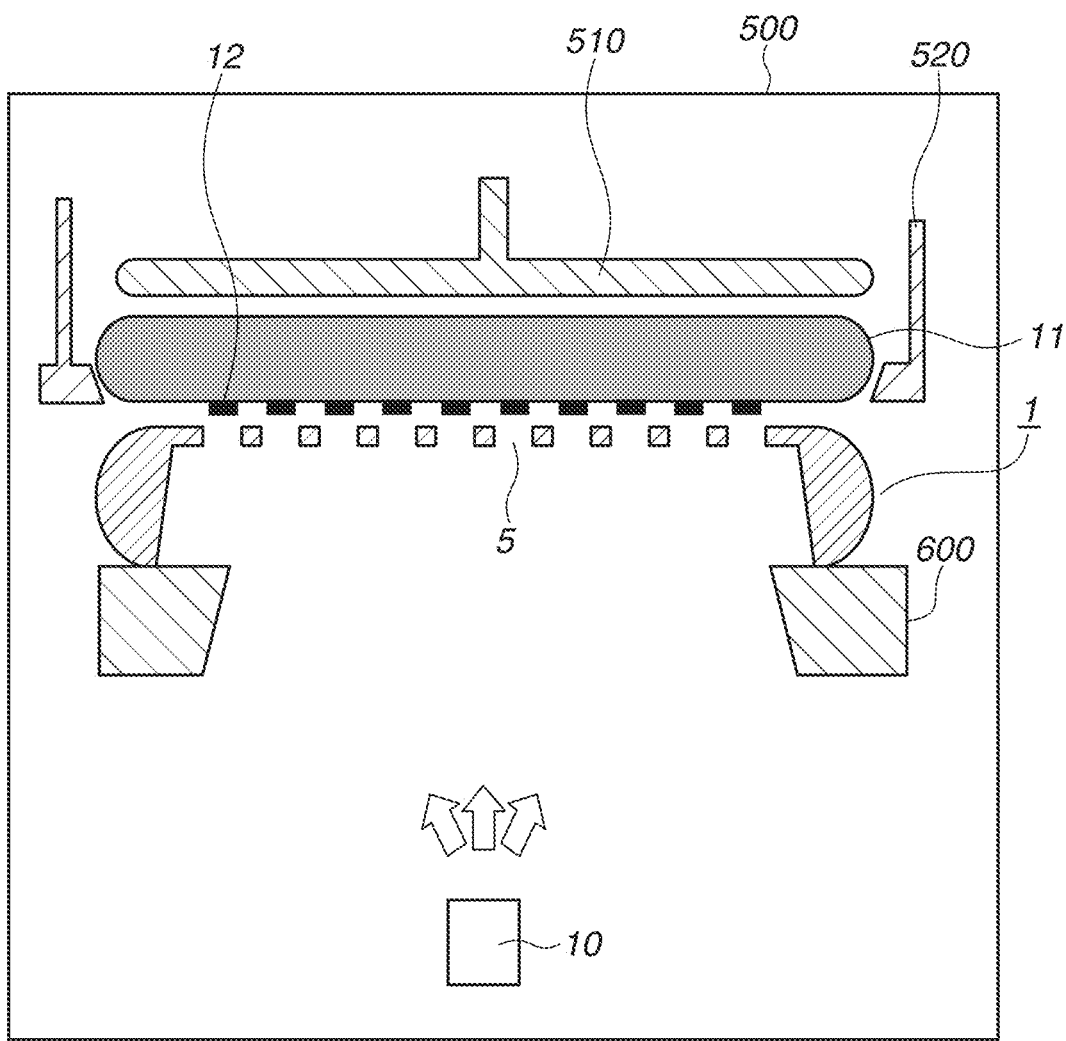
FIG. 5 is a cross-section diagram illustrating a vapor deposition mask according to a second exemplary embodiment.

In FIG. 5, a vapor deposition apparatus 500 (vapor deposition chamber) is provided with the vapor deposition material source 10 that ejects a sublimated vapor deposition material, and a substrate holder 520 (holding mechanism) that holds the vapor-deposited substrate 11. In addition, the vapor deposition apparatus 500 is provided with a mask base 600 (holding mechanism) that holds the vapor deposition mask 1, and a fixing plate 510 that positions the vapor-deposited substrate 11 and the vapor deposition mask 1. The vapor deposition mask 1 is arranged between the vapor-deposited substrate 11 and the vapor deposition material source 10. In FIG. 5, the mask base 600 directly holds the vapor deposition mask 1, but as described below, a mask holder may hold the vapor deposition mask 1 and the mask base 600 may hold the vapor deposition mask 1 and the mask holder.

The vapor deposition mask 1 and the vapor-deposited substrate 11 are position-adjusted by the substrate holder 520 and the mask base 600 being driven. That is, an alignment step is performed.

A light-emitting material, which is a vapor deposition material ejected from the vapor deposition material source 10, passes through the through-hole 5, and a film of the light-emitting material is formed as a light-emitting material portion 12 at a desired position of the vapor-deposited substrate 11. As the light-emitting material, a white organic material, or red, green, and blue (R, G, and B) organic materials can be selected. In a case of the white organic material, the OLED can be produced, for example, by forming the light-emitting material portion 12 as a film in a light-emitting area corresponding to a through-hole width of 30 mm, and forming a color filter (not illustrated), an electrode (not illustrated), and the like.

In a case of separately applying the R, G, and B organic materials, the R, G, and B organic materials need to be formed as a film at a desired position of the vapor-deposited substrate 11 on a pixel-by-pixel basis, and a positional relationship of the through-holes 5 in the vapor deposition mask 1 is changed depending on each color of R, G, and B. The width of the through-hole 5 is reduced to several micrometers in accordance with a size of a pixel.

Utilizing the vapor deposition mask having the curve portion in each of the inner wall 4 and the outer edge of the outer circumference as described in the present exemplary embodiment to produce the OLED can prevent reduction of accuracy in vapor deposition position and also reduce a risk for breakage of the vapor deposition mask, and can thereby increase a manufacturing yield of the OLED.

Modification

A modification of the second exemplary embodiment relates to a case of separately applying the R, G, and B organic materials at a desired position of the vapor-deposited substrate 11 on a pixel-by-pixel basis. A description is given of a specific example in a case of separately applying the organic materials using a vapor deposition mask corresponding to each of R, G, and B.

Figure 6:
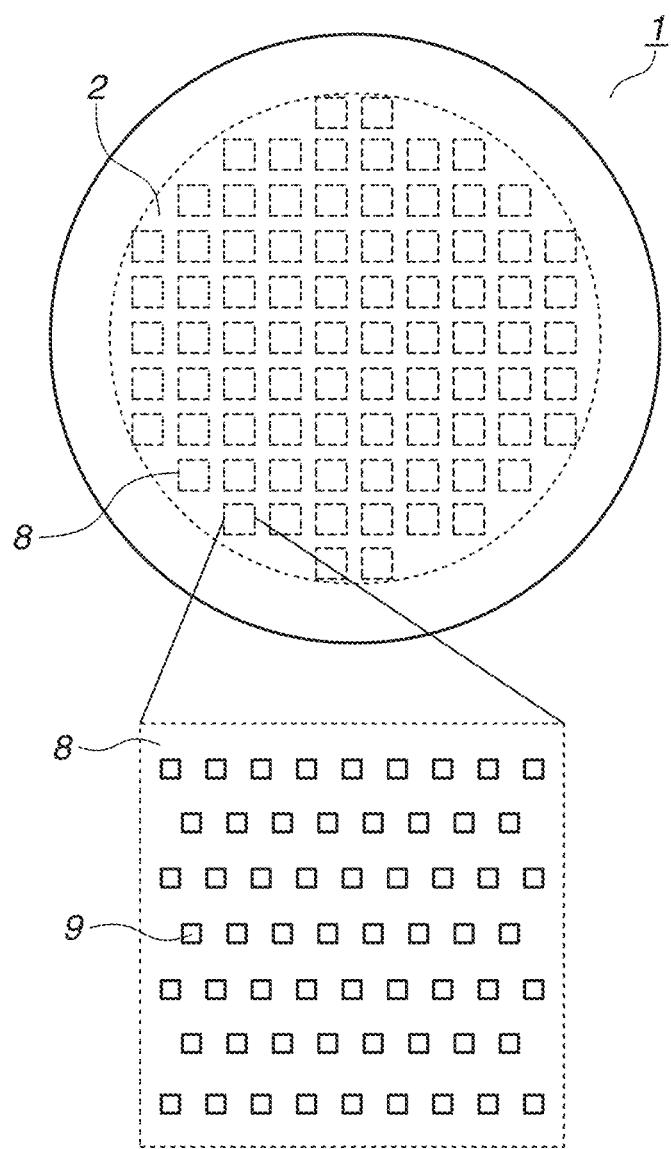
FIG. 6 is a plan illustrating a vapor deposition mask according to a modification of the second exemplary embodiment.

As illustrated in FIG. 6, a plurality of pixel areas 8 for the OLED is arranged at a desired position in the first region 100 of the vapor deposition mask 1, and a plurality of micro-through-holes 9 respectively corresponding to R, G, and B is formed in each pixel area 8. A through-hole width of the micro-through-hole 9 is several micrometers, and can be formed with high accuracy by photolithography and RIE.

Utilizing the vapor deposition mask having the curve portion in each of the inner wall 4 and the outer edge of the outer circumference as described in the present modification to produce the OLED can prevent reduction of accuracy in vapor deposition position and also reduce a risk for breakage of the vapor deposition mask, and can thereby increase a manufacturing yield of the OLED.

Figure 7A:
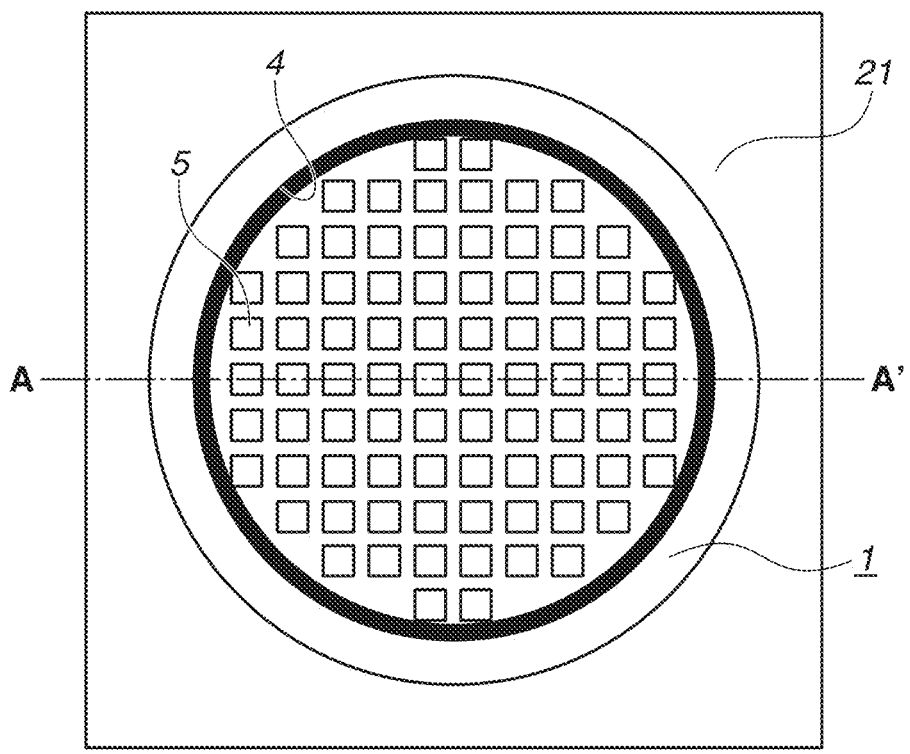
FIG. 7A is a plan of a vapor deposition mask according to a third exemplary embodiment.
Figure 7B:
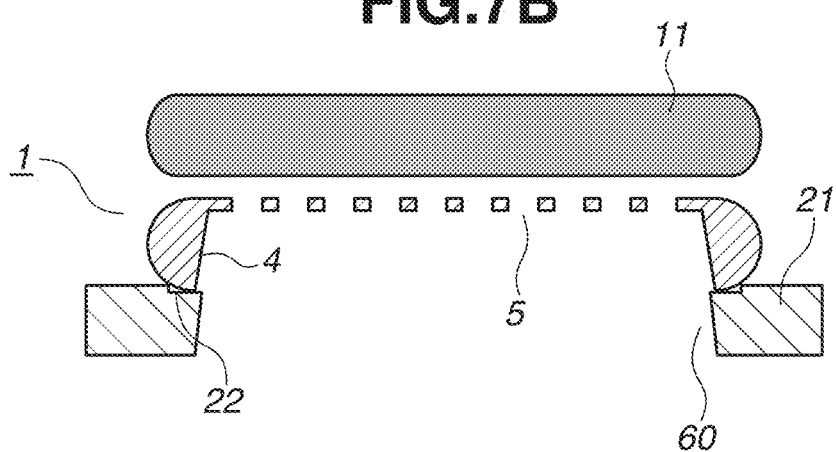
FIG. 7B is a cross-section diagram of the vapor deposition mask according to the third exemplary embodiment.
Figure 7B:
Figure 7B:

FIG. 7A is a plan of the vapor deposition mask 1 according to a third exemplary embodiment, and FIG. 7B is a cross-section diagram of the vapor deposition mask 1 along an A-A' line in FIG. 7A.

In a case of using the vapor deposition mask 1 described above, the vapor deposition mask 1 is positioned with the vapor-deposited substrate 11 in a state of being held by and fixed to the mask holder in many cases. The vapor deposition mask 1 and a mask holder 21 are arranged between the vapor deposition material source 10 and the vapor-deposited substrate 11. In FIG. 7B, assuming that the vapor-deposited substrate 11 side of the vapor deposition mask 1 is an upper surface and the vapor deposition material source 10 side is a lower surface, the mask holder 21 is arranged on the lower surface side of the vapor deposition mask 1. An opening 60 that is smaller than a diameter of the vapor deposition mask 1 is formed in the mask holder 21. The vapor deposition material ejected from the lower surface side of the vapor deposition mask 1 passes through the opening 60 of the mask holder 21 and the through-holes 5 of the vapor deposition mask 1, and is formed as a film on the vapor-deposited substrate 11.

As described in the above-mentioned exemplary embodiments, the vapor deposition mask 1 has the first region 100 in which the plurality of through-holes 5 is formed, and the inner wall 4 is formed so as to surround the space on the lower surface side in the first region 100.

In addition, a drop-down portion 22 for holding and fixing the vapor deposition mask 1 is formed on the upper surface of the mask holder 21. The drop-down portion 22 has a concave portion corresponding to the shape of the second region 200 of the vapor deposition mask 1. Since the vapor deposition mask 1 is arranged to fit the drop-down portion 22 of the mask holder 21, the vapor deposition mask 1 can be easily positioned with the mask holder 21. To infallibly fix the vapor deposition mask 1 and the mask holder 21 to each other, the vapor deposition mask 1 and the mask holder 21 may be fixed to each other by applying an adhesive (not illustrated) to the drop-down portion 22.

Since the present exemplary embodiment utilizes the vapor deposition mask 1 described above, the inner wall 4 and the outer edge of the outer circumference each have the curve portion. Hence, even in a case of dropping down the vapor deposition mask 1 formed of the semiconductor substrate onto the mask holder 21 to cause the mask holder 21 to hold the vapor deposition mask 1 and fix the vapor deposition mask 1 to the mask holder 21, the present exemplary embodiment can reduce occurrence of stress concentration on the vapor deposition mask and reduce a risk for breakage of the vapor deposition mask. In addition, the present exemplary embodiment uses the silicon substrate for the vapor deposition mask, and can thereby prevent reduction of accuracy in vapor deposition position.

Modification

Figure 8A:
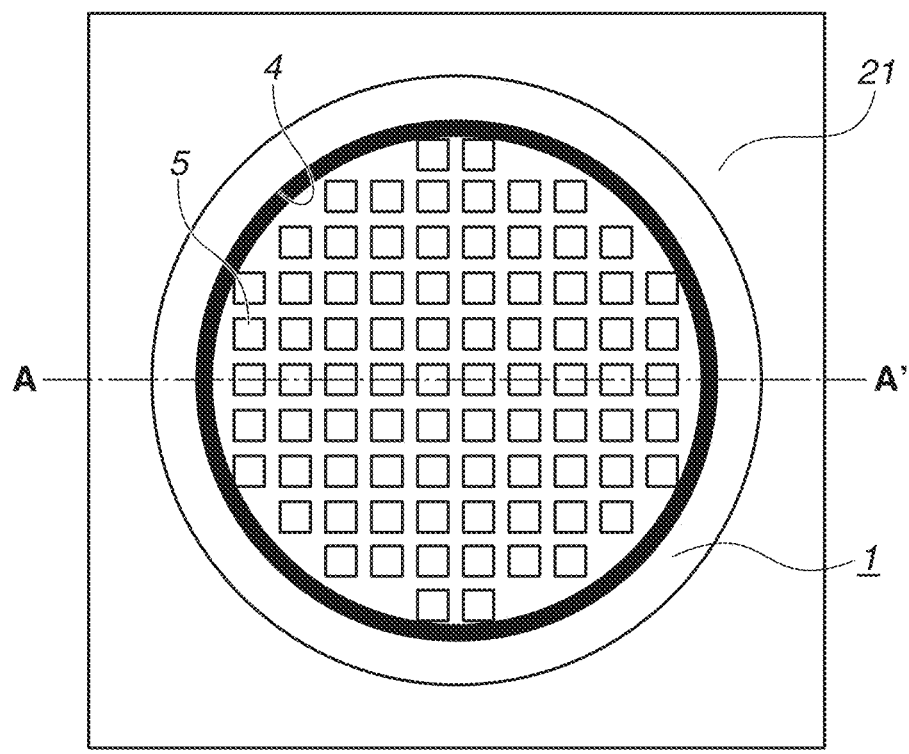
FIG. 8A is a plan of a vapor deposition mask according to a modification of the third exemplary embodiment.
Figure 8B:
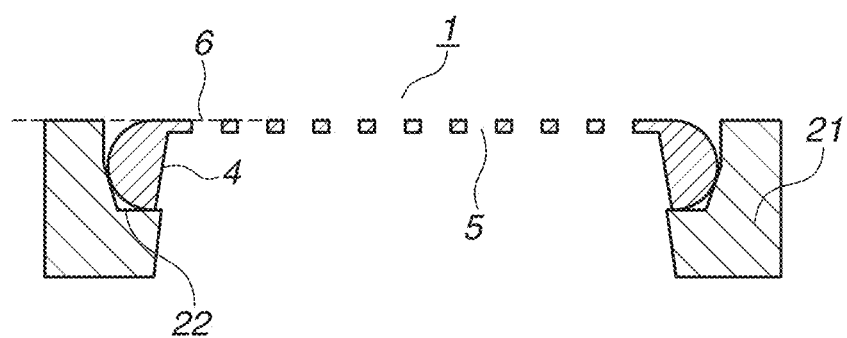
FIG. 8B is a cross-section diagram of the vapor deposition mask according to the modification of the third exemplary embodiment.

FIG. 8A is a plan of the vapor deposition mask 1 according to a modification of the third exemplary embodiment, and FIG. 8B is a cross-section diagram of the vapor deposition mask 1 along an A-A' line in FIG. 8A.

While a configuration in FIG. 8B is substantially identical to the configuration in FIG. 7B, the drop-down portion 22 is formed in the mask holder 21 having the upper surface at a height substantially identical to a height of the upper surface 6 of the vapor deposition mask 1. Making an inner edge of the drop-down portion 22 in contact with the outer edge of the vapor deposition mask 1 fixes the vapor deposition mask 1 to the mask holder 21. In comparison with the configuration illustrated in FIG. 7B, the configuration illustrated in FIG. 8B is advantageous in that merely dropping down the outer edge of the vapor deposition mask 1 to fit the inner edge of the drop-down portion 22 can facilitate positioning and fixing.

Since the present modification also utilizes the vapor deposition mask 1 described above, the inner wall 4 and the outer edge of the outer circumference each have the curve portion. Hence, even in a case of dropping down the vapor deposition mask 1 onto the mask holder 21 to hold and fix the vapor deposition mask 1, the present modification can reduce occurrence of stress concentration on the vapor deposition mask and reduce a risk for breakage of the vapor deposition mask. In addition, the present modification uses the silicon substrate for the vapor deposition mask, and can thereby prevent reduction of accuracy in vapor deposition position.

Figure 9A:
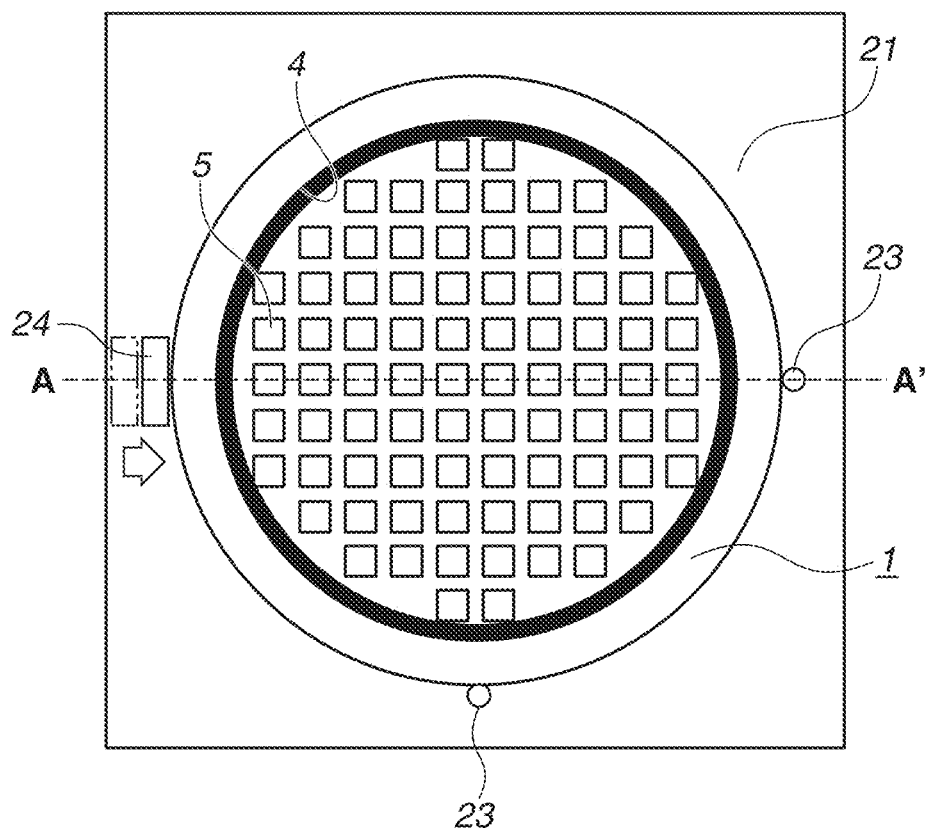
FIG. 9A is a plan of a vapor deposition mask according to a fourth exemplary embodiment.
Figure 9B:
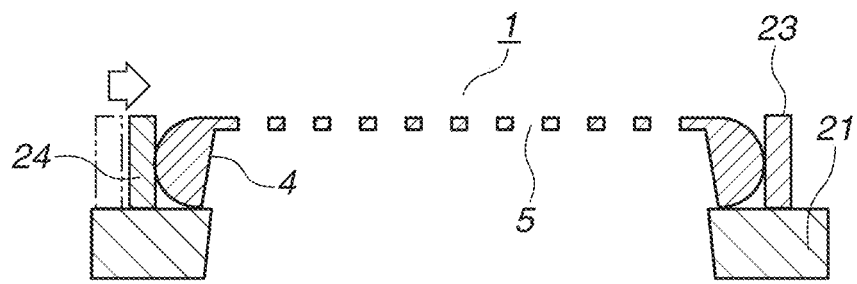
FIG. 9B is a cross-section diagram of the vapor deposition mask according to the fourth exemplary embodiment.

FIG. 9A is a plan of the vapor deposition mask 1 according to a fourth exemplary embodiment. FIG. 9B is a cross-section diagram of the vapor deposition mask 1 along an A-A' line illustrated in FIG. 9A.

Two positioning pins 23 for positioning the vapor deposition mask 1 and a movable fixing pin 24 for fixing the vapor deposition mask 1 to the mask holder 21 are arranged on the upper surface side of the mask holder 21. The vapor deposition mask 1 is positioned by the two positioning pins 23 on the mask holder 21, thereafter the movable fixing pin 24 is slid and pressed against the vapor deposition mask 1, and then the movable fixing pin 24 is fixed with a screw (not illustrated). This allows the vapor deposition mask 1 to be infallibly fixed to the mask holder 21 with high positional accuracy.

Since the present exemplary embodiment also utilizes the vapor deposition mask 1 described above, the inner wall 4 and the outer edge of the outer circumference each have the curve portion. Hence, even in a case of causing the mask holder 21 to hold the vapor deposition mask formed of the semiconductor substrate and fixing the vapor deposition mask to the mask holder 21 using the positioning pins and the movable fixing pin, the present exemplary embodiment can reduce occurrence of stress concentration on the vapor deposition mask and reduce a risk for breakage of the vapor deposition mask. In addition, the present exemplary embodiment uses the silicon substrate for the vapor deposition mask, and can thereby prevent reduction of accuracy in vapor deposition position.

First Modification

Figure 10A:
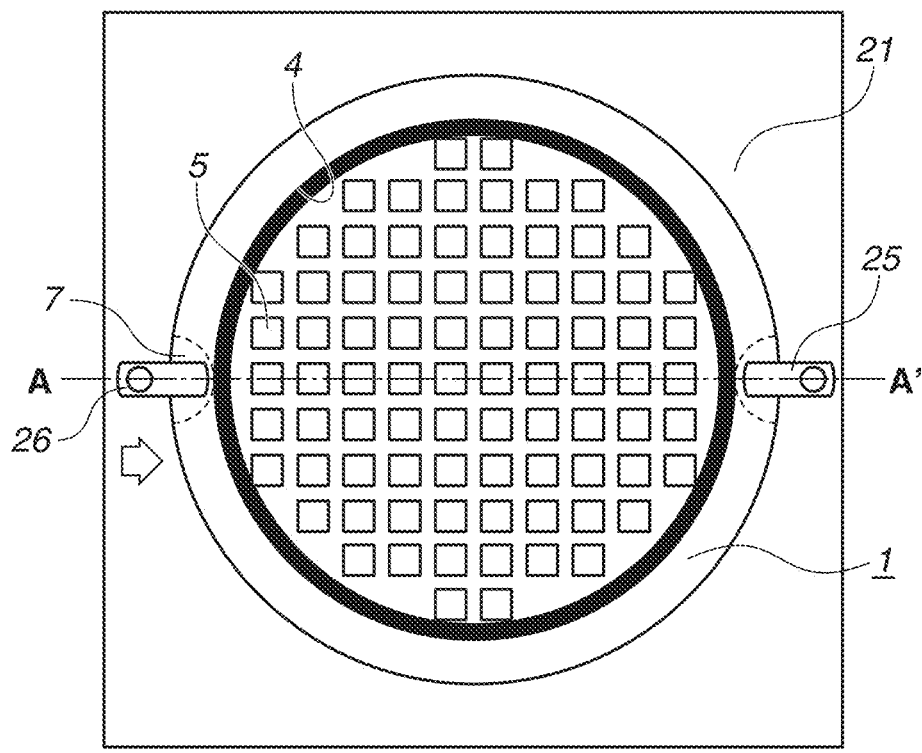
FIG. 10A is a plan of a vapor deposition mask according to a first modification of the fourth exemplary embodiment.
Figure 10B:
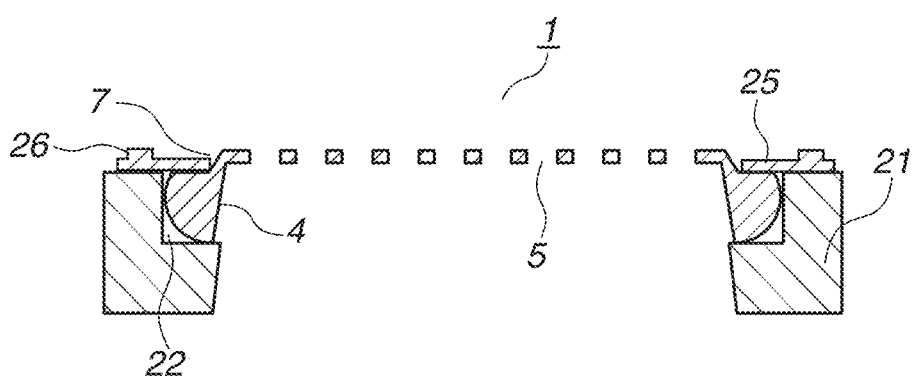
FIG. 10B is a cross-section diagram of the vapor deposition mask according to the first modification of the fourth exemplary embodiment.

FIG. 10A is a plan of the vapor deposition mask 1 according to a first modification of the fourth exemplary embodiment. FIG. 10B is a cross-section diagram of the vapor deposition mask 1 along an A-A' line illustrated in FIG. 10A.

In the present modification, a method of fixing the vapor deposition mask 1 to the mask holder 21 using a plate spring 25 will be described. The countersink portion 7 is formed in the vapor deposition mask 1. The plate spring 25 arranged on the mask holder 21 is fitted to the countersink portion 7, and thereafter the vapor deposition mask 1 and the mask holder 21 are fixed to each other using a fixing screw 26.

While positioning is performed by dropping down the vapor deposition mask 1 onto the drop-down portion 22 in FIG. 10B, positioning can be performed using the positioning pin 23 as illustrated in FIG. 9B. In addition, the vapor deposition mask 1 can be fixed by arranging the plate spring 25 and the fixing screw 26 on the positioning pin 23. In the present modification, an example of arranging plate springs 25 in two locations is illustrated, but the number of locations at which the vapor deposition mask 1 is fixed can be increased. Since there can be a plurality of locations in which the vapor deposition mask 1 is fixed to the mask holder 21, the present modification can more infallibly fix the vapor deposition mask 1 to the mask holder 21.

Since the present modification also utilizes the vapor deposition mask 1 described above, the inner wall 4 and the outer edge of the outer circumference each have the curve portion. Hence, even in a case of causing the mask holder to hold the vapor deposition mask formed of the semiconductor substrate and fixing the vapor deposition mask to the mask holder using the plate spring, the present modification can reduce occurrence of stress concentration on the vapor deposition mask and reduce a risk for breakage of the vapor deposition mask. In addition, the present modification uses the silicon substrate for the vapor deposition mask, and can thereby prevent reduction of accuracy in vapor deposition position.

Second Modification

Figure 11A:
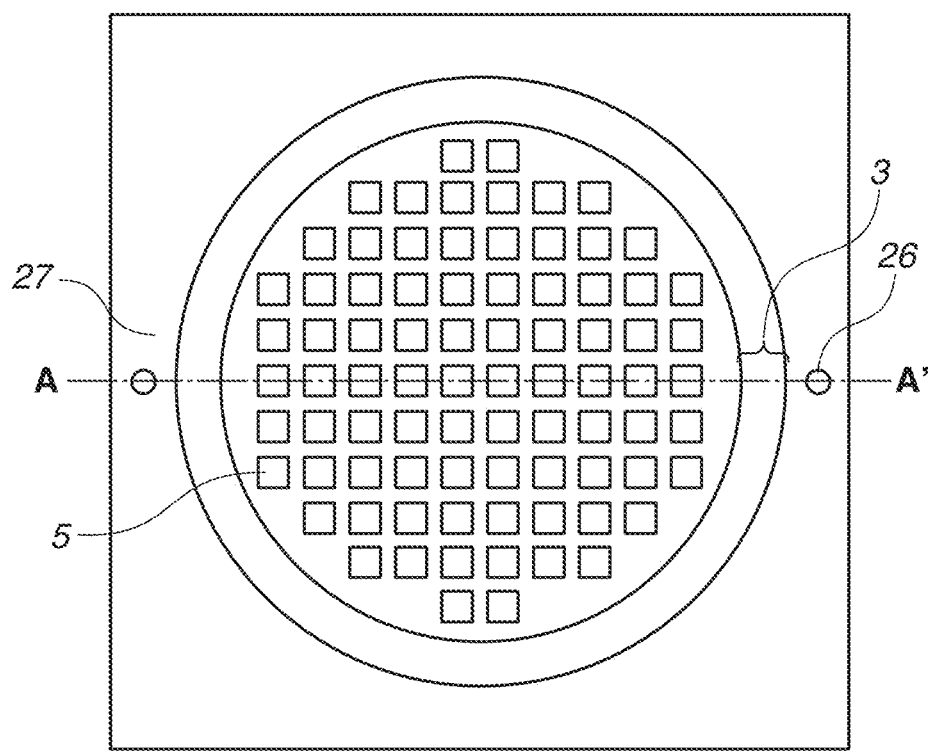
FIG. 11A is a plan of a vapor deposition mask according to a second modification of the fourth exemplary embodiment.
Figure 11B:
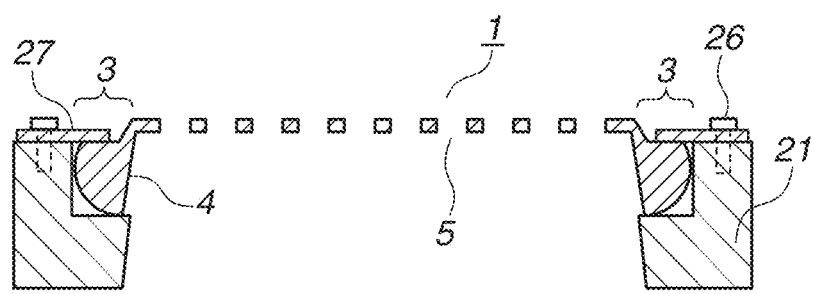
FIG. 11B is a cross-section diagram of the vapor deposition mask according to the second modification of the fourth exemplary embodiment.

FIG. 11A is a plan of the vapor deposition mask 1 according to a second modification of the fourth exemplary embodiment. FIG. 11B is a cross-section diagram of the vapor deposition mask 1 along an A-A' line illustrated in FIG. 11A.

In the present modification, a method of fixing the vapor deposition mask 1 to the mask holder 21 using a fixing plate 27 will be described. The fixing plate 27 having a through-hole that is larger in diameter than the inner wall 4 of the vapor deposition mask 1 is made to cover the vapor deposition mask 1 and the mask holder 21 from the above, and is fixed to the mask holder 21 with the fixing screw 26. Since the fixing plate 27 fixes the vapor deposition mask 1 so as to cover a substantially entire circumference of the second region 200 of the vapor deposition mask 1, the present modification can more infallibly fix the vapor deposition mask 1.

Since the present modification also utilizes the vapor deposition mask 1 described above, the inner wall 4 and the outer edge of the outer circumference each have the curve portion. Hence, at the time of causing the mask holder to hold the vapor deposition mask formed of the semiconductor substrate and fixing the vapor deposition mask to the mask holder using the fixing plate, the present modification can reduce occurrence of stress concentration on the vapor deposition mask and reduce a risk for breakage of the vapor deposition mask. In addition, the present modification uses the silicon substrate for the vapor deposition mask, and can thereby prevent reduction of accuracy in vapor deposition position.

Third Modification

Figure 12A:
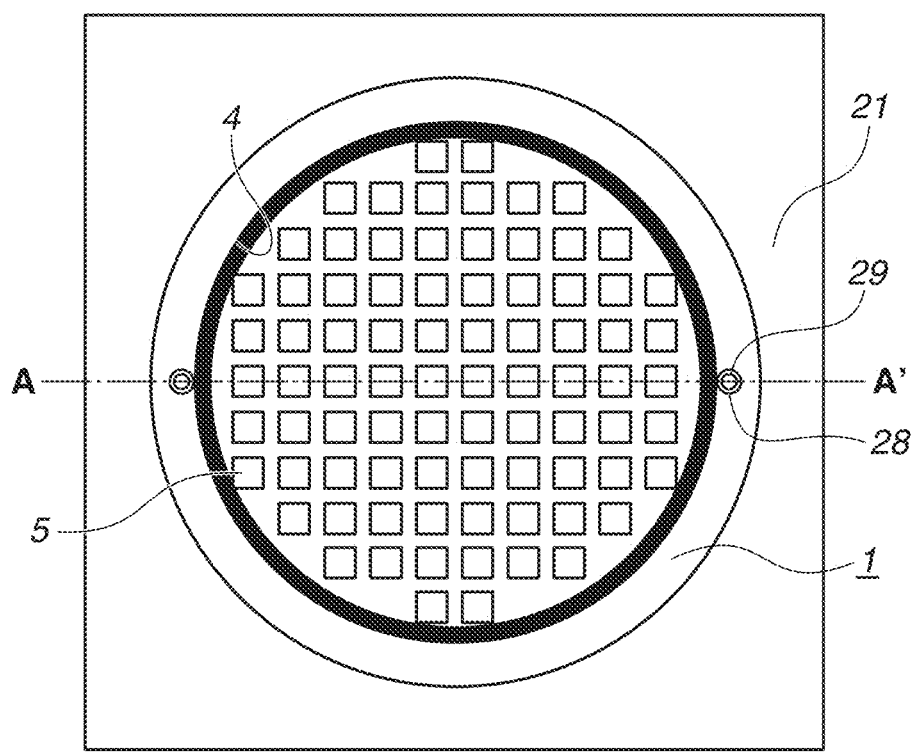
FIG. 12A is a plan of a vapor deposition mask according to a third modification of the fourth exemplary embodiment.
Figure 12B:
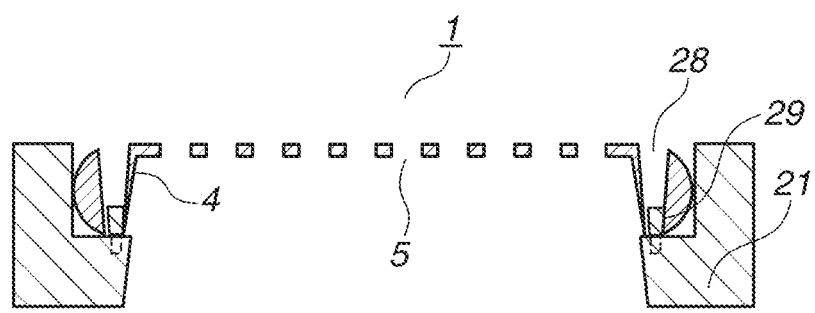
FIG. 12B is a cross-section diagram of the vapor deposition mask according to the third modification of the fourth exemplary embodiment.

FIG. 12A is a plan of the vapor deposition mask 1 according to a third modification of the fourth exemplary embodiment. FIG. 12B is a cross-section diagram of the vapor deposition mask 1 along an A-A' line illustrated in FIG. 12A.

In the present modification, a method of fixing the vapor deposition mask 1 to the mask holder 21 using a fixing pin 29 will be described. A through-hole 28 is formed in the vapor deposition mask 1, and the fixing pin 29 having an outer diameter that is almost identical to an inner diameter of the through-hole 28 is pressed against the through-hole 28 in the mask holder 21 to fix the vapor deposition mask 1. Since the fixing pin 29 is inserted through the through-hole 28 and fixed to a hole formed in the mask holder 21, the vapor deposition mask 1 and the mask holder 21 can be easily and simultaneously fixed and positioned only by the fixing pin 29.

Since the present modification also utilizes the vapor deposition mask 1 described above, the inner wall 4 and the outer edge of the outer circumference each have the curve portion. Hence, at the time of causing the mask holder 21 to hold the vapor deposition mask formed of the semiconductor substrate and fixing the vapor deposition mask to the mask holder 21 using the fixing pin, the present modification can reduce occurrence of stress concentration on the vapor deposition mask and reduce a risk for breakage of the vapor deposition mask. In addition, the present modification uses the silicon substrate for the vapor deposition mask, and can thereby prevent reduction of accuracy in vapor deposition position.

Fourth Modification

Figure 13A:
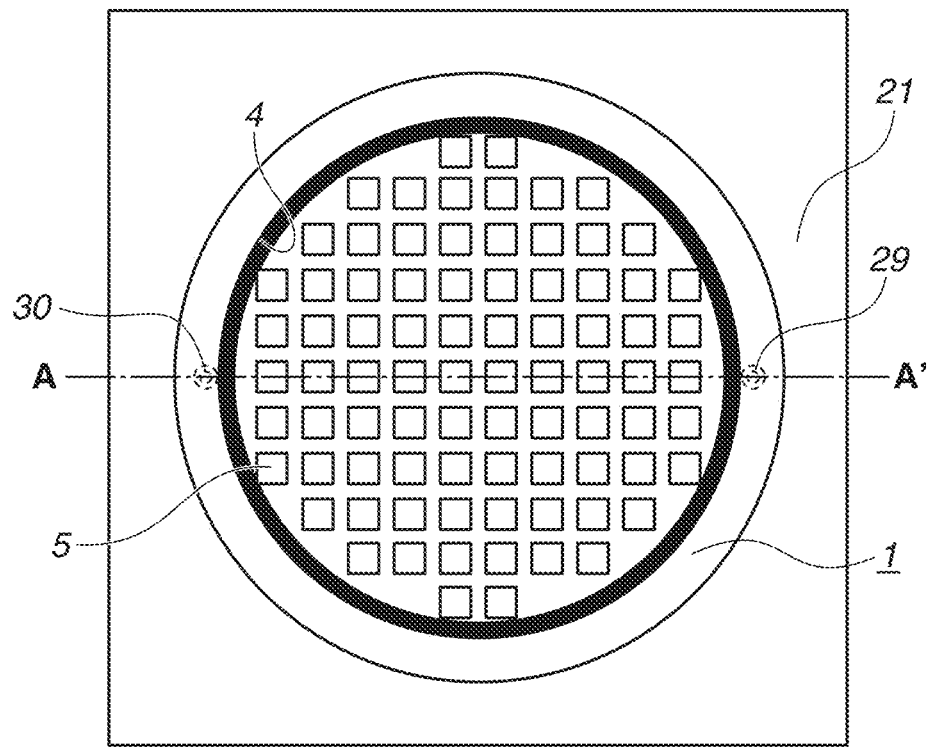
FIG. 13A is a plan of a vapor deposition mask according to a fourth modification of the fourth exemplary embodiment.
Figure 13B:
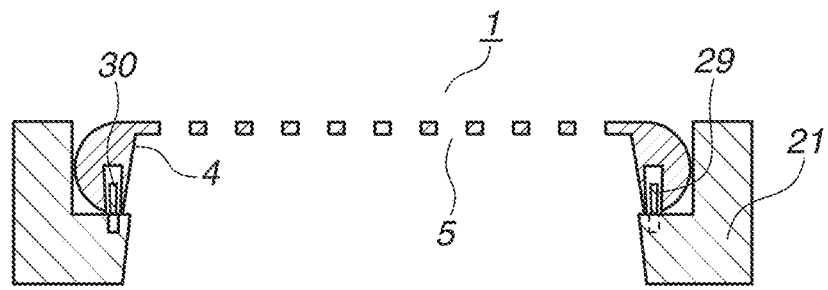
FIG. 13B is a cross-section diagram of the vapor deposition mask according to the fourth modification of the fourth exemplary embodiment.

FIG. 13A is a plan of the vapor deposition mask 1 according to a fourth modification of the fourth exemplary embodiment. FIG. 13B is a cross-section diagram of the vapor deposition mask 1 along an A-A' line illustrated in FIG. 13A.

In the present modification, a method of fixing the vapor deposition mask 1 to the mask holder 21 using the fixing pin 29 similarly to the configuration of FIGS. 11A and 11B will be described. The present modification is different from the configuration illustrated in FIGS. 12A and 12B in that the fixing pin 29 is not arranged inside the through-hole 28 of the vapor deposition mask 1 unlike the configuration in FIG. 12B, but an escape portion 30 that is formed on the lower surface side of the vapor deposition mask 1 and that is not penetrating is arranged, as illustrated in FIG. 13B. In addition, the vapor deposition mask 1 and the mask holder 21 can be simultaneously fixed and positioned similarly to the configuration in FIGS. 12A and 12B. Furthermore, since the through-hole 28 is not formed unlike the configuration in FIGS. 12A and 12B, the present modification can increase mechanical strength of the vapor deposition mask 1, and decrease a possibility of breakage. To prevent cracking of the vapor deposition mask 1 at the time of arranging the vapor deposition mask 1, it is preferable to use the fixing pin 29 formed of, for example, rubber.

Since the present modification also utilizes the vapor deposition mask 1 described above, the inner wall 4 and the outer edge of the outer circumference each have the curve portion. Hence, at the time of causing the mask holder 21 to hold the vapor deposition mask formed of the semiconductor substrate and fixing the vapor deposition mask to the mask holder 21 using the fixing pin, the present modification can reduce occurrence of stress concentration on the vapor deposition mask and reduce a risk for breakage of the vapor deposition mask. In addition, the present modification uses the silicon substrate for the vapor deposition mask, and can thereby prevent reduction of accuracy in vapor deposition position.

Fifth Modification

Figure 14A:
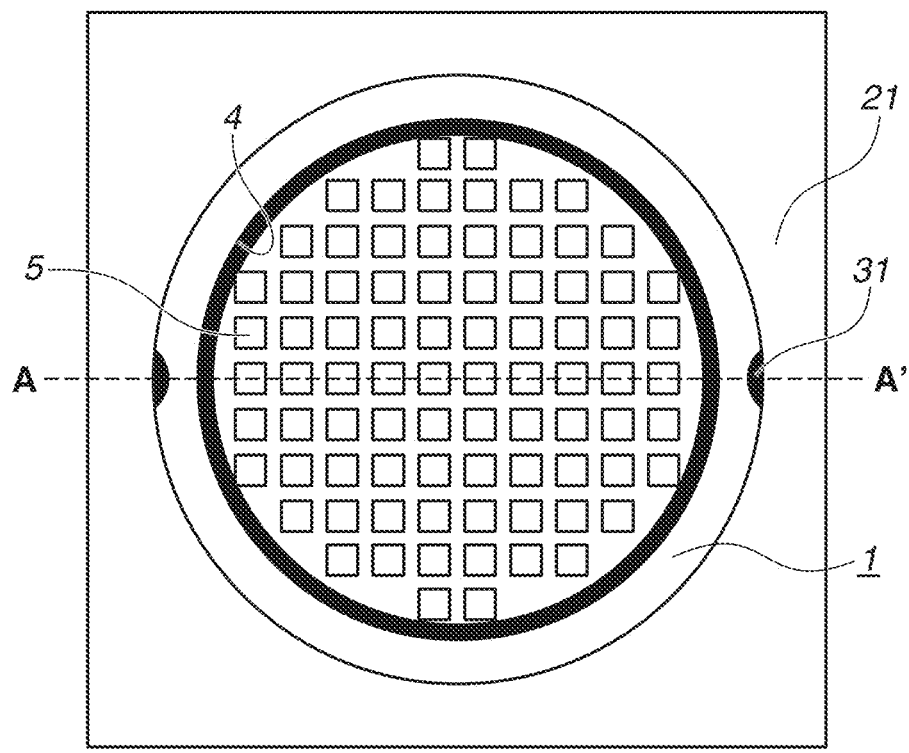
FIG. 14A is a plan of a vapor deposition mask according to a fifth modification of the fourth exemplary embodiment.
Figure 14B:
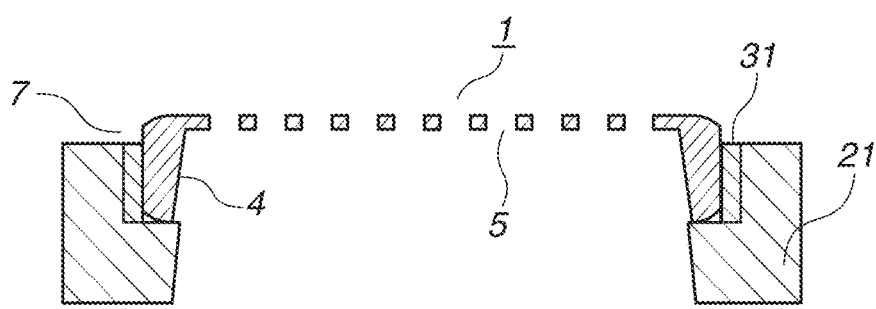
FIG. 14B is a cross-section diagram of the vapor deposition mask according to the fifth modification of the fourth exemplary embodiment.
Figure 15A:
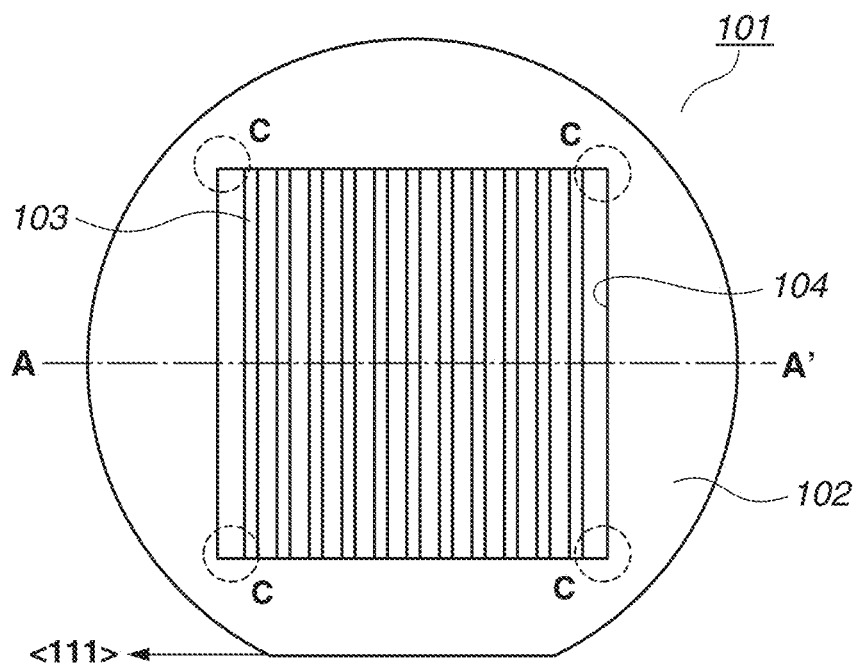
FIG. 15A is a plan of a vapor deposition mask according to a related art.
Figure 15B:
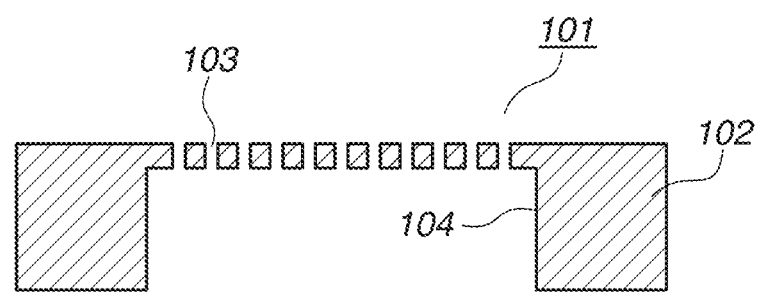
FIG. 15B is a cross-section diagram of the vapor deposition mask according to the related art.

FIG. 14A is a plan of the vapor deposition mask 1 according to a fifth modification of the fourth exemplary embodiment. FIG. 14B is a cross-section diagram of the vapor deposition mask 1 along an A-A' line illustrated in FIG. 14A.

In the present modification, a method of fixing the vapor deposition mask 1 described above to the mask holder 21 provided with a convex portion 31 is described. The countersink portion 7 is formed at the outer circumference of the vapor deposition mask 1, the convex portion 31 having a shape of being fitted to the countersink portion 7 is formed on the mask holder 21, and the vapor deposition mask 1 is arranged so that the convex portion 31 of the mask holder 21 is fitted to the countersink portion 7 of the vapor deposition mask 1. The convex portion 31 may be produced by machining the mask holder 21 or bonding another material to the mask holder 21.

The countersink portion 7 of the vapor deposition mask 1 according to the present modification is, unlike the countersink portion 7 illustrated in FIGS. 10A and 10B, the one obtained by removing part of the vapor deposition mask 1. That is, the countersink portion 7 is formed as a concave portion in a plan view. Since the countersink portion 7 (concave portion) of the vapor deposition mask 1 and the convex portion 31 of the mask holder 21 are fixed to each other by fitting, the vapor deposition mask 1 and the mask holder 21 can be easily positioned and fixed to each other.

Since the present modification also utilizes the vapor deposition mask 1 described above, the inner wall 4 and the outer edge of the outer circumference each have the curve portion. Hence, at the time of causing the mask holder to hold the vapor deposition mask formed of the semiconductor substrate and fixing the vapor deposition mask to the mask holder by fitting, the present modification can reduce occurrence of stress concentration on the vapor deposition mask and reduce a risk for breakage of the vapor deposition mask. In addition, the present modification uses the silicon substrate for the vapor deposition mask, and can thereby prevent reduction of accuracy in vapor deposition position. While the plurality of exemplary embodiments of the present disclosure has been described, the present disclosure is not limited to these exemplary embodiments. The exemplary embodiments described above can be changed and combined as appropriate.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-180170, filed Oct. 28, 2020, which is hereby incorporated by reference herein in its entirety.

What is claimed is:

1. A vapor deposition mask, comprising:
a silicon substrate including: a first region that has a first thickness and that includes a part in which a plurality of through-holes is arranged; and a second region that is arranged at an outer circumference of the first region and that has a second thickness that is greater than the first thickness,
wherein the first region and the second region are made from the silicon substrate,
wherein the silicon substrate has an inner wall, an edge of the inner wall being at a boundary between the first region and the second region, and
wherein an outer edge of the inner wall has a curve portion in a plan view.

2. The vapor deposition mask according to claim 1, wherein an angle between the inner wall and an upper surface of the silicon substrate in the first region is an acute angle.

3. The vapor deposition mask according to claim 1, wherein the outer edge of the inner wall has a circular shape in the plan view.

4. The vapor deposition mask according to claim 1, wherein an outer edge of the silicon substrate in the second region includes a curve portion in the plan view.

5. The vapor deposition mask according to claim 1,
wherein inner wall includes a first step and a second step,
wherein the second step is arranged closer to the first region than the first step is to the first region, and
wherein an angle between a second inner wall that constitutes the second step and an upper surface of the silicon substrate in the first region is smaller than an angle between a first inner wall that constitutes the first step and the upper surface of the silicon substrate in the first region.

6. The vapor deposition mask according to claim 1, wherein part of an upper surface of the silicon substrate in the second region is lower than an upper surface of the silicon substrate in the first region.

7. The vapor deposition mask according to claim 1, wherein a thickness of the silicon substrate in the second region is 200 μm to 750 μm.

8. A vapor deposition mask, comprising:
a silicon substrate including: a first region that has a first thickness and that includes a part in which a plurality of through-holes is arranged; and a second region that is arranged at an outer circumference of the first region and that has a second thickness that is greater than the first thickness,
wherein the first region and the second region are made from the silicon substrate,
wherein the silicon substrate has an inner wall, an edge of the inner wall being at a boundary between the first region and the second region,
wherein an outer edge of the inner wall has a curve portion in a plan view, and
wherein part of an upper surface of the silicon substrate in the second region is lower than an upper surface of the silicon substrate in the first region.

9. The vapor deposition mask according to claim 8, wherein the outer edge of the inner wall has a circular shape in the plan view.

10. The vapor deposition mask according to claim 8, wherein an outer edge of the silicon substrate in the second region includes a curve portion in the plan view.

11. The vapor deposition mask according to claim 8,
wherein the inner wall includes a plurality of steps in a cross-section view,
wherein the plurality of steps includes a first step and a second step,
wherein the second step is arranged closer to the first region than the first step is to the first region, and
wherein an angle between a second inner wall that constitutes the second step and the upper surface of the silicon substrate in the first region is smaller than an angle between a first inner wall that constitutes the first step and the upper surface of the silicon substrate in the first region.

12. The vapor deposition mask according to claim 8, wherein a thickness of the silicon substrate in the second region is 200 μm to 750 μm.

13. A vapor deposition apparatus, comprising:
the vapor deposition mask according to claim 1; and
a holding mechanism configured to hold the vapor deposition mask between a vapor deposition material and a vapor-deposited substrate.

14. A method of manufacturing a device, the method comprising:
aligning a vapor deposition mask and a vapor-deposited substrate with each other; and
vapor-depositing a vapor deposition material on the vapor-deposited substrate using the vapor deposition mask,
wherein the vapor deposition mask comprising a silicon substrate including: a first region that has a first thickness and that includes a part in which a plurality of through-holes is arranged; and a second region that is arranged at an outer circumference of the first region and that has a second thickness that is greater than the first thickness,
wherein the first region and the second region are made from the silicon substrate,
wherein the silicon substrate has an inner wall, an edge of the inner wall being at a boundary between the first region and the second region, and
wherein an outer edge of the inner wall has a curve portion in a plan view.

15. The method of manufacturing the device according to claim 14, wherein the device is an organic light emitting diode (OLED).

16. A device on which a vapor deposition material is vapor-deposited using the vapor deposition mask according to claim 1.

17. The device according to claim 16, wherein the device is an organic light emitting diode (OLED).

18. A mask holder configured to hold the vapor deposition mask according to claim 1.

19. The mask holder according to claim 18, further comprising a concave portion corresponding to a shape of the second region.

20. The mask holder according to claim 19, further comprising a pin to fix the vapor deposition mask to the mask holder.

* * * * *